United States Patent [19]

Yamagata

[11] Patent Number: 5,083,188
[45] Date of Patent: Jan. 21, 1992

[54] INTEGRATED CIRCUIT HAVING SUPERCONDUCTIVE WIRINGS

[75] Inventor: Tadato Yamagata, Hyogo, Japan

[73] Assignee: Mitsubishi Denki Kabushiki Kaisha, Tokyo, Japan

[21] Appl. No.: 618,024

[22] Filed: Nov. 27, 1990

Related U.S. Application Data

[63] Continuation of Ser. No. 241,886, Sep. 8, 1988, abandoned.

[30] Foreign Application Priority Data

Sep. 8, 1987 [JP] Japan ............................. 62-224479

[51] Int. Cl.$^5$ ............... H01L 23/48; H01L 29/46; H01B 12/00; H04B 1/00
[52] U.S. Cl. .......................... 357/71; 357/68; 505/703; 505/704; 505/856; 505/887; 505/1
[58] Field of Search ............ 357/69, 71, 82, 83, 357/68, ; 505/782, 874, 703, 704, 856, 866, 887, 1; 333/99 S

[56] References Cited

U.S. PATENT DOCUMENTS

| | | | |
|---|---|---|---|
| 4,660,061 | 4/1987 | Sweeny et al. | 505/874 |
| 4,748,494 | 5/1988 | Yamada et al. | 357/68 |
| 4,805,420 | 2/1989 | Porter et al. | 357/83 |
| 4,837,609 | 6/1989 | Gurvitch et al. | 357/71 |
| 4,843,445 | 6/1989 | Stemme | 357/68 |
| 4,949,157 | 8/1990 | Minami | 357/68 |

FOREIGN PATENT DOCUMENTS 60-123060 1/1987 Japan ..................... 357/71

OTHER PUBLICATIONS

"Superconductivity Above 90K in the Compound YBa$_2$Cu$_3$O$_x$:Structural, Transport, and Magnetic Properties".
Grant et al., Physical Review B, vol. 35, #13, 1 May 1987, pp. 7242-7244.
"A New High-Temperature Superconductor: Bi$_2$Sr$_{3-x}$Ca$_x$Cu$_2$O$_{8+y}$" Subramanian et al., Science, vol. 239, 26 Feb. 1988, pp. 1015-1017.
"Bi—Sr—Ca—Cu—O Superconductor System With Critical Temperatures of 80 and 107 K", Kugimiya et al., App. Phys. Lett. vol. 52, #22, 30 May 1988, pp. 1895-1896.
Klein et al., "Ion Beam Disposition of in Situ Superconducting Y—Ba—Cu—O Films," Appl. Phys. Lett. 56 (4), Jan. 22, 1990, pp. 394-396.
S. Chromik, "High T$_o$Y—Ba—Cu—O Thin Films Prepared by in Situ Low-Temperature Codeposition of Y, BaF$_2$, and Cu on α—Al$_2$O$_3$ substrates, "Appl. Phys. Lett. 56 (22), May 28, 1990, pp. 2237-2239.
Mogro-Campero et al., "Lower Temperature Post-Annealing of Thin Films of YBa$_2$Cu$_3$O$_7$ at Lower Oxygen Partial Pressure," Appl. Phys. Lett. 58 (4), Jan. 28, 1991, pp. 417-418.
Nakamura et al., Applied Physics Society Extended Abstract of 1990 Spring National Meeting (Lecture Number 28p-V-1).
Aoki, The Theory of Applied Physics, Chapter 7, Section 1 (Published by Asakura Shoten, © 1969).
Ekin, Panson and Blankenship, "Method for Making Low-Resistivity Contacts to High T$_c$ Superconductors," Appl. Phys. Lett. 52 (4), Jan. 25, 1988, pp. 331-333.

Primary Examiner—Rolf Hille
Assistant Examiner—Mahshid Saadat
Attorney, Agent, or Firm—Lowe, Price, LeBlanc & Becker

[57] ABSTRACT

An integrated circuit having a superconductive wiring comprises a semiconductor substrate, an integrated circuit device formed on the semiconductor substrate and a wiring connected to the integrated circuit device. The wiring is formed of a superconductive material and has a wide portion for heat radiation. The manufacturing method of the same comprises the steps of preparing a semiconductor substrate, forming an integrated circuit device on the semiconductor substrate, and connecting a wiring having a wide portion for heat radiation and formed of a superconductive material to the integrated circuit device on the semiconductor substrate.

8 Claims, 3 Drawing Sheets

INTEGRATED CIRCUIT HAVING SUPERCONDUCTIVE WIRINGS

This application is a continuation of application Ser. No. 07/241,886 filed Sept. 8, 1988, now abandoned.

BACKGROUND OF THE INVENTION

1. Field of the Invention

The present invention relates to integrated circuits and, more specifically, to an integrated circuit having a wiring formed of superconductive materials.

2. Description of the Prior Art

In a large scale integrated circuit such as semiconductor memory devices, the ratio of delay in the wiring portion to the delay in the entire device increases as the degree of integration becomes higher and higher. In association with the foregoing, the difference between the effect of Al and a superconductor used as wirings of the LSI is studied by simulation in an article "How much can superconductive wirings improve the speed of LSI? " in Nikkei Electronics, 1987-11-30, pp. 153-164. According to the above mentioned article, it is effective to increase the speed of operation of the device to form the wiring portion by a superconductive material in a large scale integrated circuit.

FIG. 1 shows one example of a conventionally proposed integrated circuit employing a superconductive material as a wiring. Referring to FIG. 1, an insulator 2 is arranged on a semiconductor substrate 1, and devices such as FET and the like, not shown, are formed therein. A superconductive wiring 3 is arranged on the insulator 2 with a contact portion 4 of the superconductive wiring 3 connected to said device.

In an integrated circuit having superconductive wirings such as shown in FIG. 1, Joule heat of the device itself increases the temperature during operation. Therefore, there is a possibility that the temperature of some portions of the superconductive material constituting the wiring exceed the critical temperature. The wiring would have no superconductivity at those portions and would be changed to resistance. Therefore, signal delay is generated at those portions, causing discrepancy of timing between signals in the device and therefore causing malfunctions.

SUMMARY OF THE INVENTION

An object of the present invention is to provide an integrated circuit having superconductive wirings in which the superconductive material forming the wiring portion do not exceed the critical temperature even if Joule heat is generated during the operation of the device.

Another object of the present invention is to provide a method for manufacturing such integrated circuit having superconductive wirings.

The integrated circuit having a superconductive wiring in accordance with the present invention comprises a semiconductor substrate, an integrated circuit device formed on the semiconductor substrate and a wiring connected to the integrated circuit device. The wiring is formed of a superconductive material and has a wide portion for heat radiation.

Since the integrated circuit having the superconductive wiring in accordance with the present invention comprises a wide portion provided on the superconductive wiring to enhance the heat radiating efficiency, it has superior heat radiating effect and is hardly heated. Therefore, even if the temperature of the device increases due to the Joule heat during the operation, the temperature of the superconductive material forming the wirings hardly exceeds the critical temperature. Therefore, the problem in the prior art, that is, portions of the superconductive material are changed to resistances causing signal delay to deviate the timing between signals can be eliminated, and therefore, there will be no malfunction.

The method for manufacturing the semiconductor device having superconductive wirings in accordance with the present invention comprises the steps of preparing a semiconductor substrate, forming an integrated circuit device on the semiconductor substrate, and connecting a wiring formed of a superconductive material and having a wide portion for heat radiation to the integrated circuit device on the semiconductor substrate.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
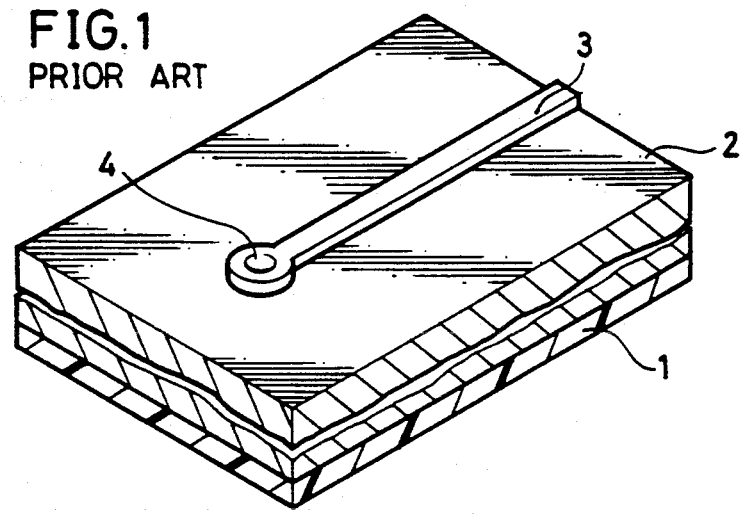
FIG. 1 is a partial perspective view showing a conventional integrated circuit having a superconductive wiring.
Figure 2:
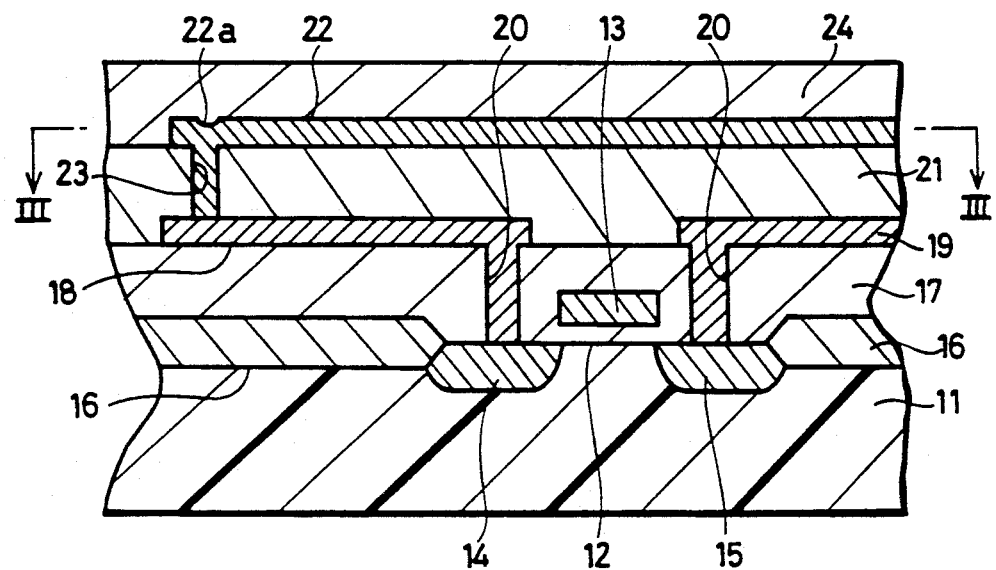
FIG. 2 is a partial vertical sectional view of an integrated circuit having a superconductive wiring in accordance with one embodiment of the present invention.

Referring to FIG. 2 showing one embodiment of the present invention, a gate electrode 13 is arranged on a surface region of a semiconductor substrate 11 with a dielectric film 12 interposed therebetween. Source drain regions 14 and 15 formed of impurity diffused layers are formed on the surface region of the semiconductor substrate 11 adjacent to the gate electrode 13. A field oxide film ($SiO_2$ film) 16 for isolating elements is formed on that region of the surface of the semiconductor substrate 11 which is adjacent to the source/drain regions 14 and 15. An interlayer insulating film 17 is formed on the source/drain regions 14 and 15 and on the field oxide film 16. Wirings 18 and 19 are arranged on the interlayer insulating films 17. Contact holes 20 are formed on the entire insulating films 17 at portions corresponding to the said source/drain regions 14 and 15, respectively. Wirings 18 and 19 are electrically connected to the source/drain regions 14 and 15, respectively, through the contact holes 20. The wirings 18 and 19 have two-layer structure comprising $WSi_2$ and polysilicon.

Figure 3:
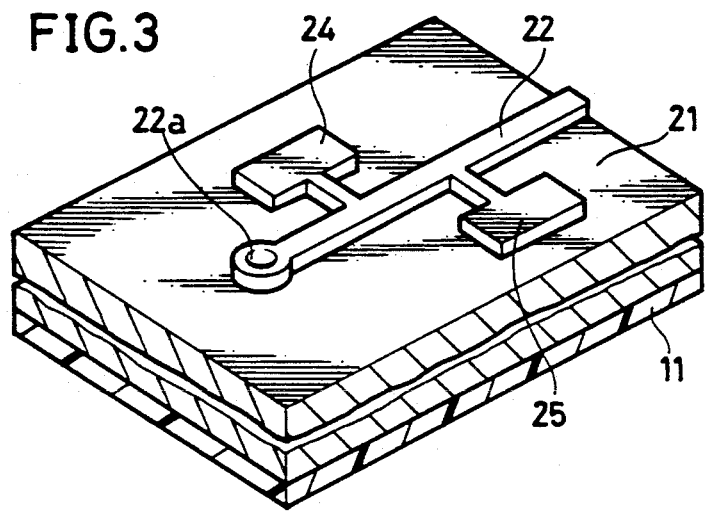
FIG. 3 is a cross sectional view taken along the line III—III of FIG. 2.

A SiO₂ oxide film 21 is formed on the interlayer insulating film 17, and on the wirings 18 and 19. A superconductive wiring 22 is arranged on the SiO₂ oxide film 21. The tip end portion 22a of the superconductive wiring 22 is electrically connected to the wiring 18 through a contact hole 23 formed in the SiO₂ oxide film 21. As shown in FIG. 3, the superconductive wiring 22 comprises integrally formed wide wiring portions 24 and 25 for heat radiation. In order to enhance the heat radiating effect, the wide wiring portions 24 and 25 have their end portions enlarged. Materials showing superconductive characteristics such as Y system ceramic superconductive material (Y-Ba-Cu-0 and the like) or a Bi system ceramic superconductive material (for example Bi-Sr-Ca-Cu-0) is used as the material of the superconductive wiring 22. Various superconductive materials other than the above described materials may be employed. In consideration of the necessity of cooling, it is preferable to employ materials showing superconductivity at higher temperature. A protecting film 26 is arranged on the SiO₂ oxide film 21 and on the superconductive wiring 22.

The above described integrated circuit employing the superconductive wiring can be used in the similar manner as a normal integrated circuit. In that case, the wide wiring portions 24 and 25 improve heat radiating efficiency of the superconductive wiring 22 and prevents the temperature of the superconductive wiring 22 from exceeding the critical temperature. Therefore, no portion of the superconductive material changes into a resistance. Consequently, there will be no signal delays which cause discrepancy of timing between signals, and therefore there will be no malfunction.

Figure 4:
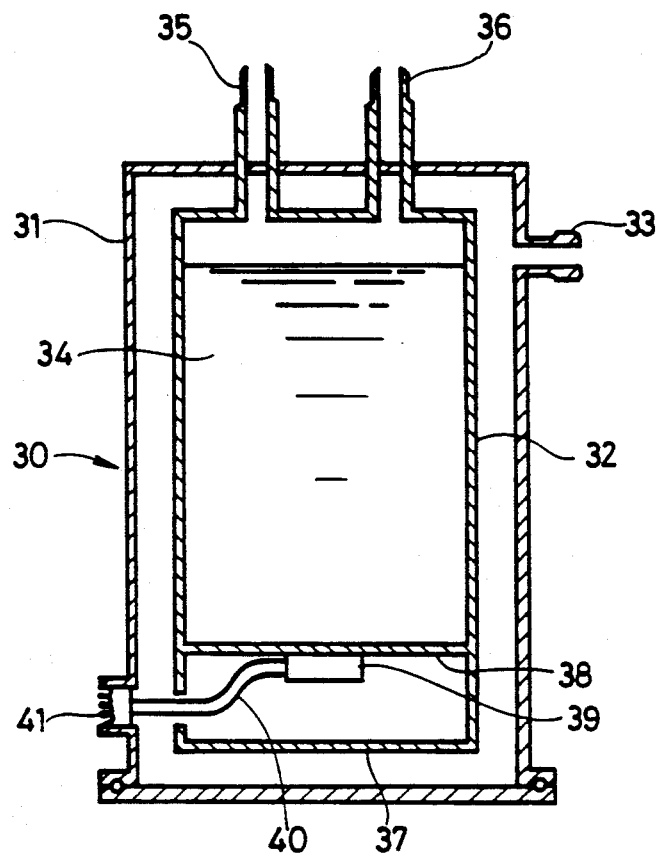
FIG. 4 is a schematic vertical sectional view of a cooling apparatus for using the integrated circuit having superconductive wirings.

If the critical temperature of the superconductive material employed as the superconductive wiring 22 is low, a cooling apparatus such as shown in FIG. 4 is used. Referring to FIG. 4, the cooling apparatus 30 comprises a vacuum cylinder 31 and a liquid nitrogen container 32 contained in the vacuum cylinder 31. The vacuum cylinder 31 comprises an outlet 33.

The liquid nitrogen container 32 is filled with liquid nitrogen 34. An inlet 35 of liquid nitrogen 34 and an outlet 36 of nitrogen gas are provided on the upper end of the liquid nitrogen container 32. An integrated circuit containing room 37 is provided below the liquid nitrogen container 32. In the containing room 37, an integrated circuit device 39 having the structure shown in FIGS. 2 and 3 is attached on a side surface 38 on the side of the liquid nitrogen 34. A signal line and a power supply line 40 are connected to the device 39 and the end portions thereof are connected to an external terminal 41. The device 39 is cooled by the above described cooling apparatus 30 so that it is maintained at a temperature lower than the critical temperature of the superconductive material employed as the wiring 22. By doing so, the electric resistance of the superconductive wiring 22 becomes approximately 0 Ω, and the RC time constant of the wiring portion becomes approximately 0, eliminating delay in wiring. Therefore, the discrepancy of the timing between signals in the device can be decreased, preventing malfunctions.

If the critical temperature of the superconductive material employed as the wiring 22 is high, there is no need to employ a special cooling apparatus such as the cooling apparatus 30. If a superconductive material which shows superconductivity at normal room temperature is used, there is no need of the cooling apparatus.

In the following, a method for manufacturing the integrated circuit device shown in FIGS. 2 and 3 will be described.

Figure 5A:
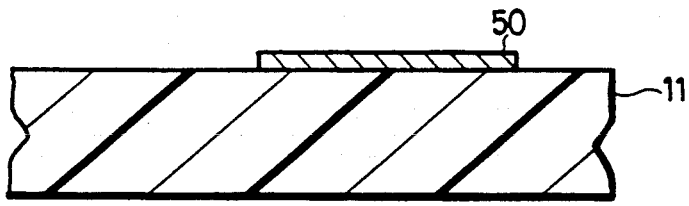
FIGS. 5A to 5E are vertical sectional views showing the steps of manufacturing method in accordance with the present invention.
Figure 5B:
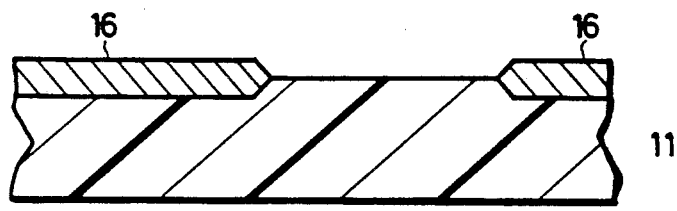
Figure 5C:
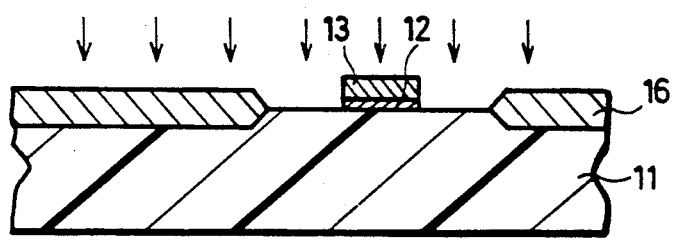
Figure 5D:
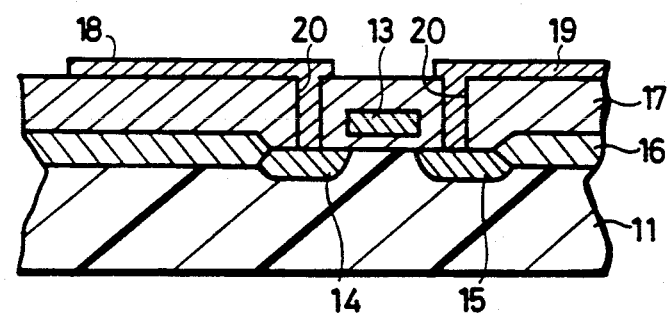
Figure 5E:
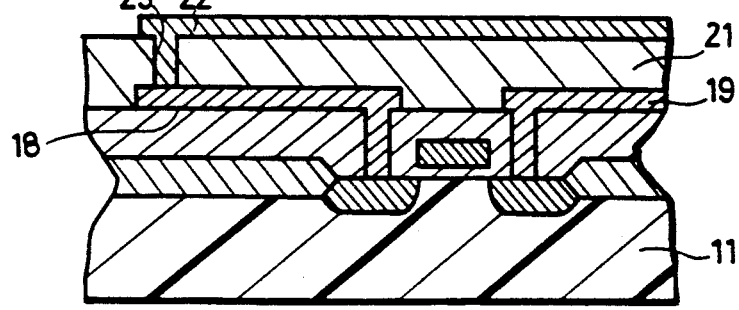

First, as shown in FIG. 5A, a silicon nitride film 50 (SiN film) is deposited on a semiconductor substrate 11 and the silicon nitride film 50 is patterned. Then, as shown in FIG. 5B, field oxidation process is carried out to form a field oxide film 16 of SiO₂ and thereafter, the silicon nitride film 50 is removed. Thereafter, as shown in FIG. 5C, a dielectric film 12 of SiO₂ is formed and a gate electrode 13 formed of polysilicon is formed thereon. By implanting arsenic the source/drain regions 14 and 15 are formed as shown in FIG. 5D. Thereafter, an interlayer insulating film 17 is deposited and contact holes 20 are formed at positions corresponding to the source/drain regions 14 and 15. Thereafter, wirings 18 and 19 are formed and connected to the source/drain regions 14 and 15 through the contact holes 20. Then, as shown in FIG. 5E, the SiO₂ oxide film 21 is deposited thereon and a contact hole 23 is formed. The superconductive wiring 22 is formed thereon. Finally, the whole device is covered by a protecting film 26, and thus the integrated circuit having the superconductive wiring such as shown in FIGS. 2 and 3 is provided.

Figure 6:
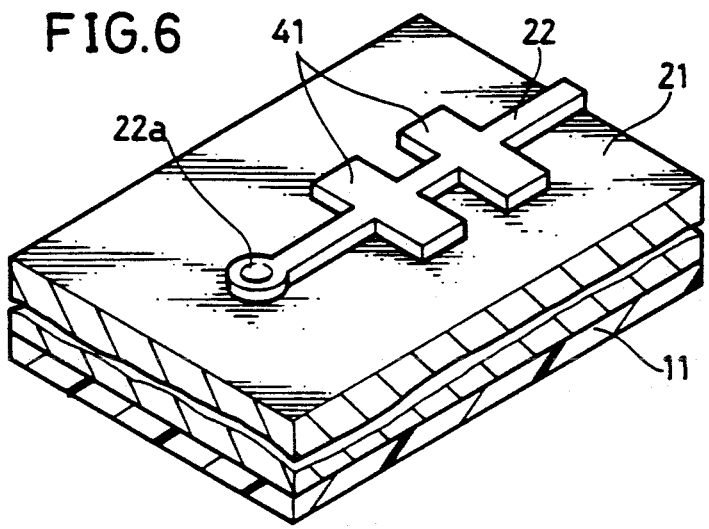
FIG. 6 shows an integrated circuit having a superconductive wiring in accordance with another embodiment of the present invention, corresponding to FIG. 3.

The shape of the wide wiring portion of the superconductive wiring 22 is not limited to that shown in FIG. 3 and various shapes may be employed so long as they enhance the heat radiating effect. For example, wide portion such as shown in FIG. 6 may be formed as the wide wiring portion 41.

Although description was given of a device including MOS.FET in the foregoing, the present invention may be applied to other devices constituted by other active elements such as a bipolar transistor or HMT. Cooling apparatus is not limited to the above described type but various other types of cooling apparatus may be employed.

As described above, according to the present invention, the temperature of the superconductive wiring is prevented from exceeding the critical temperature and therefore the superconductive material forming the wiring is prevented from being locally changed into resistances, thereby eliminating malfunctions caused by discrepancy of timing between signals.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An integrated circuit comprising:
   a semiconductor substrate;
   an integrated circuit device formed on said semiconductor substrate; and
   a superconductive wiring connected to said integrated circuit device; wherein
   said superconductive wiring comprises a contact portion formed of a superconductive material, and a portion for heat radiation, wherein said portion for heat radiation is separate from said contact portion.

2. An integrated circuit according to claim 1, wherein said portion for heat radiation has an enlarged end portion to enhance heat radiating effect.

3. An integrated circuit according to claim 1, wherein said superconductive wiring is a Y system or Bi system ceramic superconductive material.

4. An integrated circuit according to claim 3, wherein said superconductive wiring is formed of a superconductive material consists of Y-Ba-Cu-O or Bi-Sr-Ca-Cu-O.

5. An integrated circuit according to claim 1, wherein said integrated circuit device comprises an active device,
said active device comprising a gate electrode arranged on said semiconductor surface region, a source/drain region arranged adjacent to said gate electrode and a device wiring connected to said source/drain region, and
said superconductive wiring is connected to said device wiring.

6. An integrated circuit according to claim 1 further comprising an associated cooling apparatus to lower temperature of said integrated circuit.

7. An integrated circuit according to claim 6 wherein the cooling apparatus employs liquid nitrogen.

8. An integrated circuit comprising:
a semiconductor substrate;
an integrated circuit device formed on said semiconductor substrate;
a first wiring layer connected to said integrated circuit device; and
a second wiring layer connected to said first wiring layer, wherein said second wiring layer is a superconductive wiring comprising
(1) a contact portion formed of a superconductive material, and
(2) a portion for heat radiation, wherein said portion for heat radiation is separate from said contact portion.

* * * * *